(12) United States Patent
Chen et al.

(10) Patent No.: US 12,374,604 B2
(45) Date of Patent: Jul. 29, 2025

(54) PACKAGED POWER SEMICONDUCTOR DEVICE AND POWER CONVERTER

(71) Applicant: Huawei Digital Power Technologies Co., Ltd., Shenzhen (CN)

(72) Inventors: Dong Chen, Shanghai (CN); Lei Shi, Shanghai (CN); Yunfeng Liu, Shanghai (CN)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 485 days.

(21) Appl. No.: 17/734,310

(22) Filed: May 2, 2022

(65) Prior Publication Data

US 2022/0359349 A1 Nov. 10, 2022

(30) Foreign Application Priority Data

May 7, 2021 (CN) .......................... 202110494785.2

(51) Int. Cl.
*H01L 23/49* (2006.01)
*H01L 23/00* (2006.01)
(Continued)

(52) U.S. Cl.
CPC ............ *H01L 23/49* (2013.01); *H01L 23/367* (2013.01); *H01L 24/48* (2013.01); *H01L 25/072* (2013.01);
(Continued)

(58) Field of Classification Search
None
See application file for complete search history.

(56) References Cited

U.S. PATENT DOCUMENTS 5,672,910 A * 9/1997 Majumdar ........ H01L 23/49555
257/730
6,201,696 B1 * 3/2001 Shimizu .................. H01L 24/49
361/708
(Continued)

FOREIGN PATENT DOCUMENTS

CN 102237321 A * 11/2011
CN 102339818 A 2/2012
(Continued)

*Primary Examiner* — Sue A Purvis
*Assistant Examiner* — Jordan M Klein
(74) *Attorney, Agent, or Firm* — Maier & Maier, PLLC

(57) ABSTRACT

A packaged power semiconductor device includes a power semiconductor wafer, a heat conduction layer, and a heat sink that are sequentially stacked, and a sealing part configured to wrap and seal the power semiconductor wafer and at least part of the heat conduction layer. The packaged power semiconductor device further includes a pin, where the pin includes a connection segment wrapped inside the sealing part, and an extension segment located outside the sealing part. The connection segment is electrically connected to the power semiconductor wafer, and a shortest distance between the extension segment and a first outer surface is greater than a creepage distance corresponding to a highest working voltage of the power semiconductor wafer. This can avoid a creepage phenomenon of the pin by limiting a distance between the first outer surface and the extension segment that is of the pin and that is exposed outside the sealing part.

8 Claims, 10 Drawing Sheets

(51) Int. Cl.
 *H01L 23/367* (2006.01)
 *H01L 25/07* (2006.01)
 *H02M 7/00* (2006.01)

(52) U.S. Cl.
 CPC ... *H02M 7/003* (2013.01); *H01L 2224/48137* (2013.01); *H01L 2224/48175* (2013.01); *H01L 2924/1203* (2013.01); *H01L 2924/13055* (2013.01); *H01L 2924/1811* (2013.01); *H01L 2924/182* (2013.01)

(56) References Cited

U.S. PATENT DOCUMENTS

| | | | |
|---|---|---|---|
| 6,320,258 | B1 | 11/2001 | Mangiagli et al. |
| 6,404,065 | B1 | 6/2002 | Choi |
| 8,455,987 | B1 | 6/2013 | Spann et al. |
| 8,847,381 | B2 | 9/2014 | Ueda et al. |
| 2009/0096072 | A1* | 4/2009 | Balakrishnan .... H01L 23/49562 438/122 |
| 2013/0252381 | A1* | 9/2013 | Spann .................... H01L 21/52 438/122 |
| 2016/0365296 | A1 | 12/2016 | Otremba et al. |
| 2018/0160569 | A1 | 6/2018 | Yoshihara |

FOREIGN PATENT DOCUMENTS

| | | | |
|---|---|---|---|
| CN | 105161477 | A | 12/2015 |
| CN | 207183251 | U | 4/2018 |
| CN | 212517177 | U | 2/2021 |
| EP | 0921565 | A2 | 6/1999 |
| JP | 2003168769 | A | 6/2003 |
| KR | 20200145091 | A | 12/2020 |

* cited by examiner

PACKAGED POWER SEMICONDUCTOR DEVICE AND POWER CONVERTER

CROSS-REFERENCE TO RELATED APPLICATION

This application claims priority to Chinese Patent Application No. 202110494785.2, filed on May 7, 2021, which is hereby incorporated by reference in its entirety.

TECHNICAL FIELD

The embodiments relate to the circuit field, and in particular, to a packaged power semiconductor device and a power converter that includes the packaged power semiconductor device.

BACKGROUND

Packaged power semiconductor devices are usually applied to semiconductor circuits, to be used as power converters for implementing functions such as alternating current/direct current conversion and direct current voltage boost/buck. Semiconductor circuits that include power converters are also usually applied to devices such as solar inverters, motor drivers, and uninterruptible power supplies, to be used as boost circuits or inverter circuits.

To implement miniaturization of a packaged power semiconductor device, an integration degree of components in the packaged power semiconductor device needs to be improved. However, a packaged power semiconductor device usually works in a high voltage environment, and a pin is exposed on the outside of the packaged power semiconductor device. Therefore, a pin creepage phenomenon easily occurs on a miniaturized packaged power semiconductor device.

SUMMARY

A packaged power semiconductor device and a power converter may implement miniaturization of the packaged power semiconductor device and also effectively avoid a creepage phenomenon of an exposed pin of the packaged power semiconductor device.

According to a first aspect, a packaged power semiconductor device may include: a power semiconductor wafer; a heat conduction layer, including an upper heat conduction layer, an insulation layer, and a lower heat conduction layer that are stacked, where the insulation layer is located between the upper heat conduction layer and the lower heat conduction layer, and the upper heat conduction layer is bonded to the power semiconductor wafer; a heat sink, including a first outer surface, where the first outer surface is bonded to the lower heat conduction layer; a sealing part, configured to wrap and seal the power semiconductor wafer and at least part of the heat conduction layer; and a pin, including a connection segment and an extension segment, where the connection segment is electrically connected to the power semiconductor wafer and is also wrapped in the sealing part, the extension segment is located outside the sealing part, and a shortest distance between the extension segment and the first outer surface is greater than a creepage distance corresponding to a highest working voltage of the power semiconductor wafer.

In the packaged power semiconductor device, insulation and heat dissipation functions of the power semiconductor wafer are implemented by using the power semiconductor wafer, the heat conduction layer, and the heat sink that are sequentially stacked; then, sealing and protection functions of the power semiconductor wafer are implemented by wrapping the power semiconductor wafer and at least part of the heat conduction layer by using the sealing part; and functions of current transmission and signal transmission between the power semiconductor wafer and an external circuit can be implemented by using the pin electrically connected to the power semiconductor wafer.

The pin in the packaged power semiconductor device includes the connection segment and the extension segment. The connection segment is also wrapped in the sealing part and is configured to electrically connect to the power semiconductor wafer. The extension segment is exposed outside the sealing part. In addition, a distance between the extension segment and the first outer surface of the heat sink is limited, so that the shortest distance between the extension segment and the first outer surface is greater than the creepage distance corresponding to the highest working voltage of the power semiconductor wafer. This can avoid a creepage phenomenon of the extension segment. Compared with a solution in which an exposed part of a pin is comparatively close to a heat sink, the packaged power semiconductor device has higher safety and reliability.

In a possible implementation, along a length direction of the connection segment, the connection segment has a first end and a second end that are opposite. The first end is electrically connected to the power semiconductor wafer, the second end is connected to the extension segment, and a distance between the first end and the first outer surface is less than a distance between the second end and the first outer surface.

In this implementation, a height difference is set between the two opposite ends of the connection segment, so that the electrical connection between the connection segment and the power semiconductor wafer and conduction between the connection segment and the extension segment can be separately implemented, and further, a safe distance between the extension segment and the first outer surface is ensured.

In a possible implementation, the heat conduction layer includes the upper heat conduction layer and the lower heat conduction layer that are stacked and the insulation layer located between the upper heat conduction layer and the lower heat conduction layer, a first face is located at the upper heat conduction layer, and a second face is located at the lower heat conduction layer.

In this implementation, the upper heat conduction layer and the lower heat conduction layer may be configured to implement heat dissipation of the power semiconductor wafer, and the insulation layer implements electrical isolation between the power semiconductor wafer and the heat sink.

In a possible implementation, materials of the upper heat conduction layer and the lower heat conduction layer are both aluminum, aluminum-containing alloy, copper, or copper-containing alloy, and a material of the insulation layer is ceramic.

In a possible implementation, a material of the sealing part is plastic, glass, or ceramic.

In a possible implementation, it is defined as follows: The highest working voltage of the power semiconductor wafer is V1, and the shortest distance between the extension segment and the first outer surface is D1, in which case the following condition is met: $D1 \geq V1/200+2$ (mm).

In a possible implementation, when the highest working voltage of the power semiconductor wafer is 400 V, the shortest distance between the extension segment and the first outer surface is greater than or equal to 4 mm; or when the highest working voltage of the power semiconductor wafer is 1000 V, the shortest distance between the extension segment and the first outer surface is greater than or equal to 7 mm.

In a possible implementation, the power semiconductor wafer includes one or more of a metal-oxide semiconductor field-effect transistor (MOSFET), an insulated gate bipolar transistor (IGBT), a diode, or a triode.

In a possible implementation, the power semiconductor wafer includes an insulated gate bipolar transistor and a diode.

In a possible implementation, the packaged power semiconductor device is packaged according to the TO-247 or TO-220 standard.

In a possible implementation, the power semiconductor wafer includes a first functional port. The first functional port is located on a side, of the power semiconductor wafer, closer to the upper heat conduction layer. The first functional port is electrically connected to the pin through the upper heat conduction layer.

In this implementation, each of the power semiconductor wafer and the pin is fixedly connected to the upper heat conduction layer, so that connection reliability between the pin and the power semiconductor wafer can be ensured.

In a possible implementation, the power semiconductor wafer further includes a second functional port, the upper heat conduction layer includes a first heat conduction region and a second heat conduction region that are isolated from each other, there are two pins, the first functional port is connected to one pin through the first heat conduction region, and the second functional port is connected to the other pin through the second heat conduction region.

In this implementation, the power semiconductor wafer has at least two functional ports, and implements a function by using each functional port. In this case, a plurality of pins and a plurality of mutually isolated heat conduction regions are disposed, so that each signal is transmitted through cooperation between one pin and one heat conduction region.

In a possible implementation, the packaged power semiconductor device includes a connection wire. The connection wire is connected between the second functional port of the power semiconductor wafer and the second heat conduction region, to implement an electrical connection between the second functional port and the pin fastened on the second heat conduction region.

In this implementation, the power semiconductor wafer is bonded to the first heat conduction region and makes the first functional port be connected to the first heat conduction region; and current transmission or signal transmission may be implemented between the second functional port of the power semiconductor wafer and the second heat conduction region by using the connection wire. In this way, each of the two heat conduction regions isolated from each other is configured to transmit one current or signal.

In a possible implementation, the connection wire includes a first segment and a second segment, the upper heat conduction layer further includes an intermediate heat conduction region, the first segment is connected between the second functional port and the intermediate heat conduction region, and the second segment is connected between the intermediate heat conduction region and the second heat conduction region.

In this implementation, a bridging structure can be formed for the connection wire by disposing the intermediate heat conduction region, thereby reducing a length of a single connection wire, and improving current transmission and signal transmission reliability of the packaged power semiconductor device.

In a possible implementation, the packaged power semiconductor device further includes an insulation part, and the insulation part is located between the first outer surface and the extension segment.

In this implementation, the insulation part is disposed between the extension segment and the first outer surface, so that a distance between the extension segment and the first outer surface through a surface of the sealing part or another component can be effectively increased, thereby further preventing the creepage phenomenon.

In an implementation, the insulation part is implemented in a form of an insulation film, and the insulation film covers the first outer surface in a bonded manner.

In an implementation, the insulation part is implemented through sealant pouring, and the sealant pouring structure may be further configured to wrap and protect the extension segment.

In an implementation, the insulation part wraps a periphery of the extension segment, and the insulation part and the sealing part are of a same material and are integrally formed.

In a possible implementation, the first outer surface includes a first region and a second region. The lower heat conduction layer is bonded to the first outer surface in the first region, and a projection of the extension segment on the first outer surface is located in the second region. In a direction of stacking the power semiconductor wafer and the heat conduction layer, a distance between the extension segment and the first region is less than a distance between the extension segment and the second region.

In this implementation, the first outer surface is provided as a skew structure, for example, a stepped structure or a bevel structure. This is more conducive to ensuring a safe distance between the first outer surface and the extension segment.

According to a second aspect, a power converter may include at least one packaged power semiconductor device provided in the first aspect and one controller. The controller is configured to control turn-on and turn-off of the at least one packaged power semiconductor device, to perform power conversion. It may be understood that, in the power converter provided in the second aspect, because the packaged power semiconductor device provided in the first aspect is used, effects thereof are substantially the same. Details are not described herein again.

DETAILED DESCRIPTION OF THE EMBODIMENTS

The following describes solutions in the embodiments with reference to the accompanying drawings. It is clear that the described embodiments are merely some rather than all of the embodiments. All other embodiments obtained by a person of ordinary skill in the art based on the embodiments without creative efforts shall fall within the scope of the embodiments.

Figure 1:
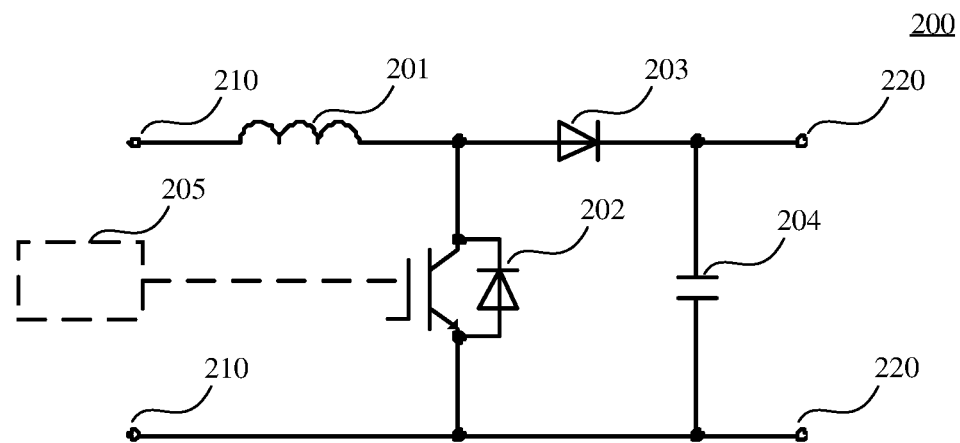
FIG. 1 is a circuit diagram of a use scenario of a power converter.

FIG. 1 is a schematic circuit diagram of a power converter, in a semiconductor circuit 200.

As illustrated in FIG. 1, the semiconductor circuit 200 is a boost circuit. The semiconductor circuit 200 includes an inductor 201, a first packaged power semiconductor device 202, a second packaged power semiconductor device 203, a capacitor 204, and a controller 205. The first packaged power semiconductor device 202 and the second packaged power semiconductor device 203 may be packaged power semiconductor devices provided in FIG. 3 to FIG. 16. The controller 205 and the first packaged power semiconductor device 202 form the power converter provided.

In this embodiment, the semiconductor circuit 200 is configured to boost a first voltage of a power supply received from an input end 210 to a second voltage and output the second voltage through an output end 220, thereby implementing a power conversion function.

The inductor 201 is configured to implement energy storage and energy release for power-supply electric energy provided by the input end 210.

The capacitor 204 is connected to the output end 220 and is configured to obtain the second voltage by filtering power-supply electric energy generated when the inductor 201 releases energy.

The second packaged power semiconductor device 203 may be a diode, is connected between the inductor 201 and the capacitor 204 and is configured to implement unidirectional energy release from the inductor 201 to the output end 220.

The controller 205 and the first packaged power semiconductor device 202 are jointly used as the power converter, that is, a controllable switch, of the semiconductor circuit 200. The controllable switch is connected to the inductor 201 and the input end 210 and is configured to provide an energy storage path for the inductor 201.

The controller 205 may be configured to control turn-on and turn-off of the first packaged power semiconductor device 202. When the first packaged power semiconductor device 202 is in an on state, the inductor 201 is connected between two input ends 210 and is on the energy storage path to store electric energy. When the first packaged power semiconductor device 202 is in an off state, the inductor 201 is connected to the output end 220 through the second packaged power semiconductor device 203 to form an energy release path, so that electric energy stored by the inductor 201 can be released, thereby achieving a voltage boost effect of the semiconductor circuit 200.

Figure 2:
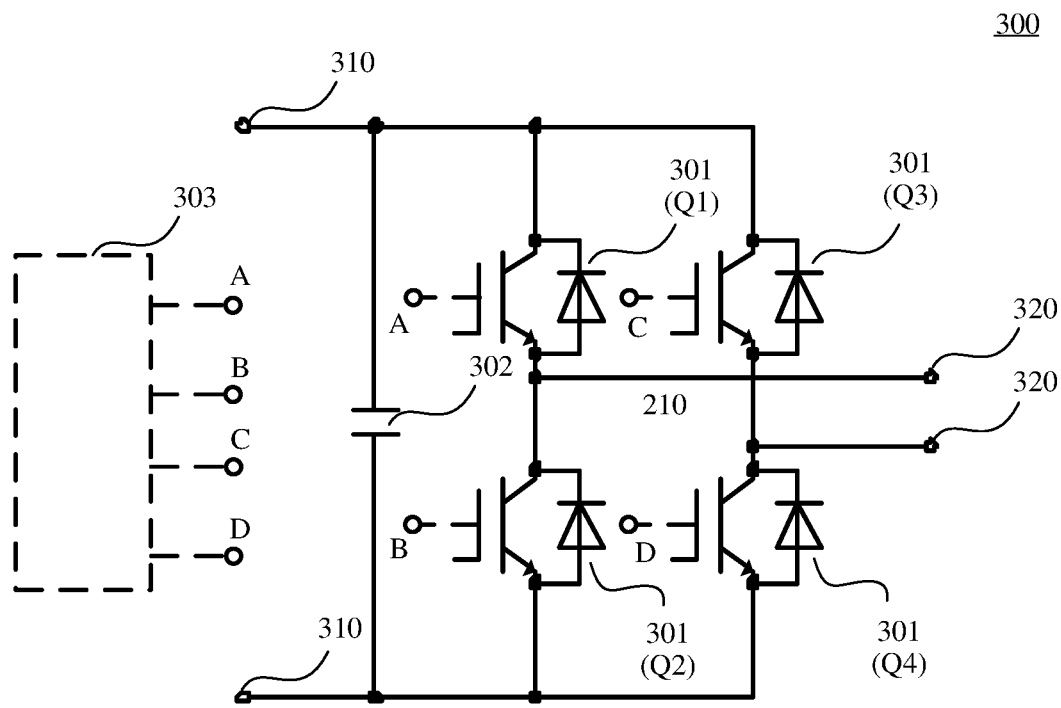
FIG. 2 is a circuit diagram of a use scenario of another power converter.

FIG. 2 is a schematic circuit diagram of another power converter, in a semiconductor circuit 300.

As illustrated in FIG. 2, the semiconductor circuit 300 is an inverter circuit. The semiconductor circuit 300 may include four packaged power semiconductor devices 301, a controller 303, and one capacitor 302. The four packaged power semiconductor devices 301 are also packaged power semiconductor devices provided in FIG. 3 to FIG. 16. The controller 303 is configured to control turn-on and turn-off of each packaged power semiconductor device 301 and acts together with each packaged power semiconductor device 301 to form the power converter provided.

The four packaged power semiconductor devices 301 are defined as switches Q1 to Q4 and constitute two bridge arms. In addition, each bridge arm includes two packaged power semiconductor devices 301 connected in series between positive and negative electrodes of the semiconductor circuit 300. The capacitor 302 is connected between positive and negative electrodes of an input end 310 and is configured to filter a voltage and a current in the input end 310 of the semiconductor circuit 300.

In the semiconductor circuit 300 shown in FIG. 2, the four packaged power semiconductor devices 301 are also used as controllable switches through control of the controller 303, and two different conductive paths are formed by controlling on and off states of the four packaged power semiconductor devices 301 in the two bridge arms.

The controller 303 may have four control ports A, B, C, and D, correspondingly controlling turn-on and turn-off of the four packaged power semiconductor devices 301: Q1, Q2, Q3, and Q4, respectively. When the switches Q1 and Q4 are in the on state, and Q2 and Q3 are in the off state, the positive and negative electrodes in the semiconductor circuit 300 are in positive phase transmission. When the switches Q2 and Q3 are in the on state, and the switches Q1 and Q4 are in the off state, the positive and negative electrodes in the semiconductor circuit 300 change to negative phase transmission. Voltages obtained by the output end 320 in the two states are in opposite polarity. In this way, the semiconductor circuit 300 illustrated in FIG. 2 implements an inverter function. Direct current-alternating current conversion or alternating current-direct current conversion can be implemented, thereby implementing a power conversion function.

It can be seen from FIG. 1 and FIG. 2 that the power converter can implement the power conversion function in both the semiconductor circuit 200 and the semiconductor circuit 300. In other words, the power converter is disposed in each of the semiconductor circuit 200 and the semiconductor circuit 300, so that a power conversion circuit is formed. The semiconductor circuit 200 and the semiconductor circuit 300 have the power conversion function, and therefore can be applied to devices such as a solar inverter, a motor driver, and an uninterruptible power supply. The first packaged power semiconductor device 202 and the second packaged power semiconductor device 203 (presented as the packaged power semiconductor devices 301 in FIG. 2) are used as controllable switches of the semiconductor circuit 200 (presented as the semiconductor circuit 300 in FIG. 2), to implement the power conversion function of the semiconductor circuit.

Figure 3:
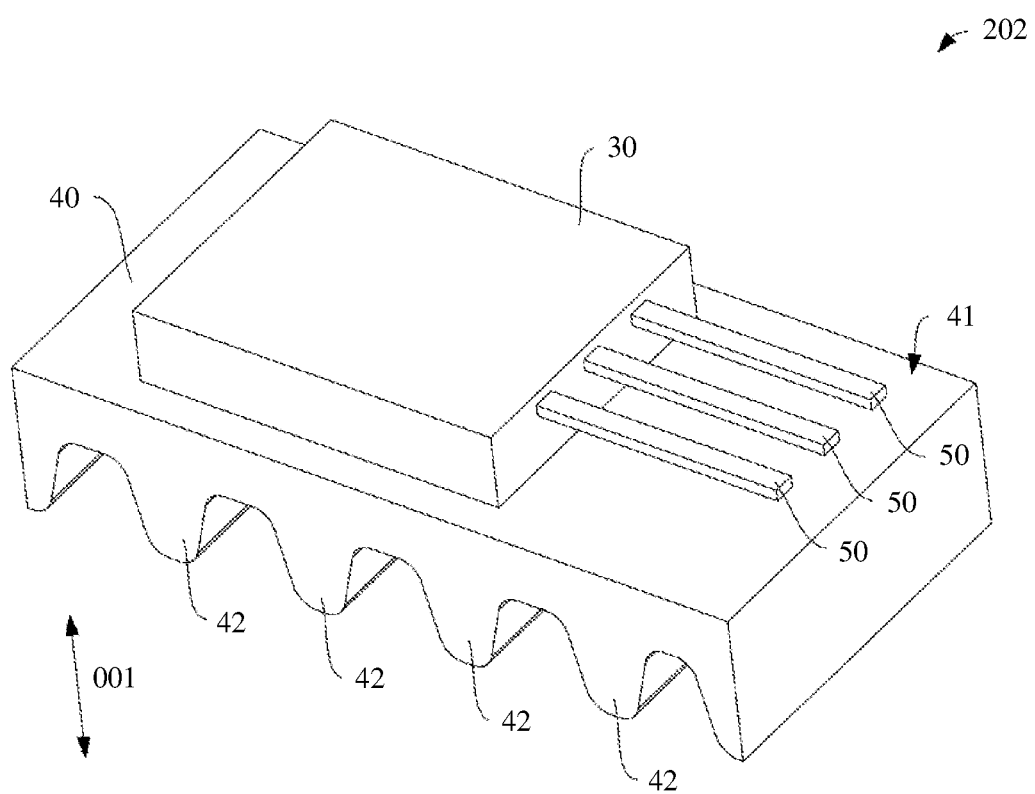
FIG. 3 is a schematic diagram of a structure of a packaged power semiconductor device.
Figure 4:
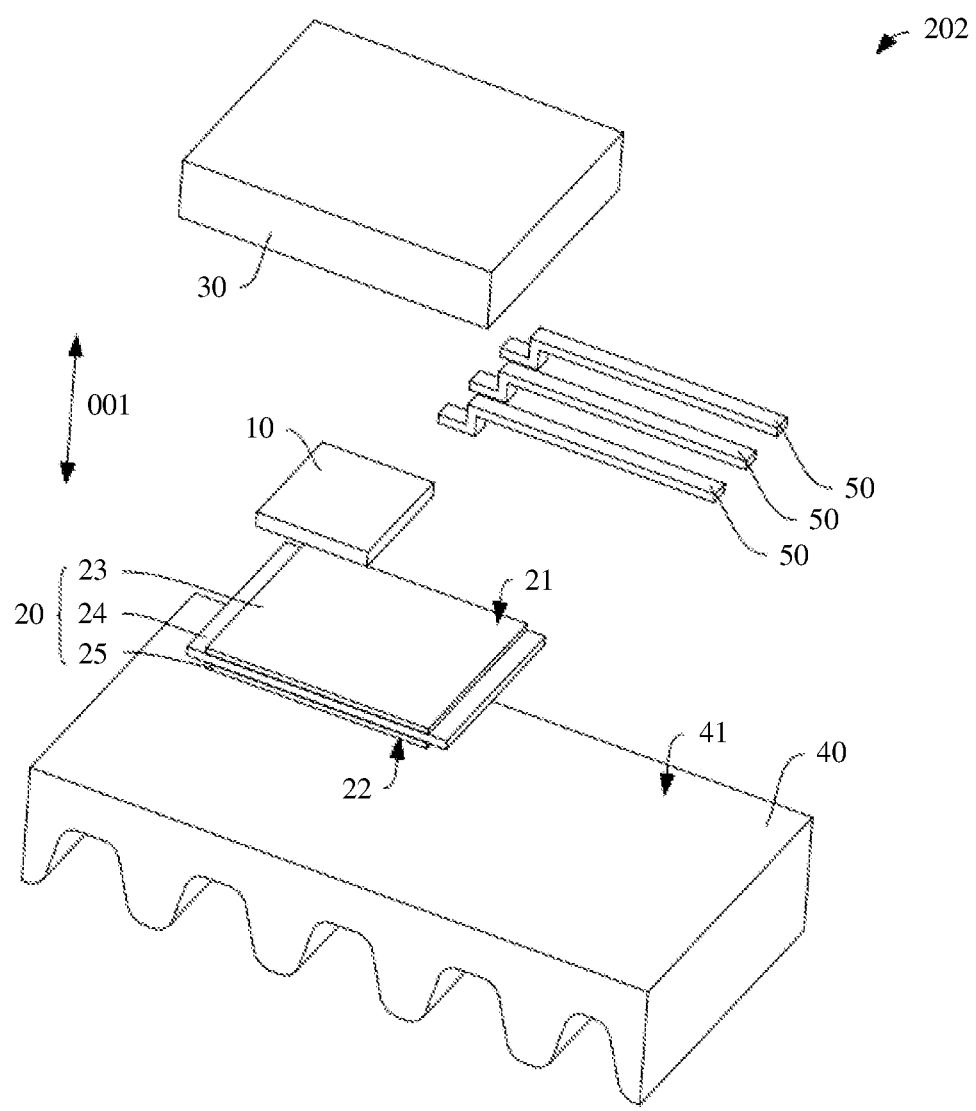
FIG. 4 is a schematic exploded view of a structure of a packaged power semiconductor device.

FIG. 3 illustrates a structure of the first packaged power semiconductor device 202. It may be understood that the structure may also be used as a structure of the second packaged power semiconductor device 203 shown in FIG. 1 and the packaged power semiconductor device 301 shown in FIG. 2. For ease of description, the following provides explanations by using only the structure of the first packaged power semiconductor device 202 as a representative. The structure may be applied to any power converter and be used as any one or more packaged power semiconductor devices in a semiconductor circuit. This may be understood with reference to an exploded diagram of the first packaged power semiconductor device 202 illustrated in FIG. 4 and a cross-sectional schematic view of the first packaged power semiconductor device 202 illustrated in FIG. 5.

The first packaged power semiconductor device 202 includes a power semiconductor wafer 10, a heat conduction layer 20, a sealing part 30, a heat sink 40, and a pin 50. The power semiconductor wafer 10, the heat conduction layer 20, and the heat sink 40 are sequentially disposed in a stacked manner along a first direction 001. The heat conduction layer 20 is located between the power semiconductor wafer 10 and the heat sink 40. The heat conduction layer 20 includes a first face 21 and a second face 22 that are opposite in the first direction 001. The heat sink 40 includes a first outer surface 41. The power semiconductor wafer 10 is bonded to the first face 21, and the heat sink 40 is bonded to the second face 22. In some embodiments, an area between the second face 22 and the heat sink 40 may be further filled with a material such as thermally conductive silicone, to implement good contact between the second face 22 and the first outer surface 41 of the heat sink 40.

The power semiconductor wafer 10 is configured to implement a function of the first packaged power semiconductor device 202 and may include one or more of a metal-oxide semiconductor field-effect transistor (MOSFET), an insulated gate bipolar transistor (IGBT), a diode, or a triode. In other words, on the first face 21, one power semiconductor wafer 10 may be disposed in a bonded manner, or a plurality of power semiconductor wafers 10 may be disposed in a bonded manner. When a plurality of power semiconductor wafers 10 are disposed on the first face 21 in the bonded manner, the plurality of power semiconductor wafers 10 may further be power semiconductor wafers of a same type or power semiconductor wafers of different types. The plurality of power semiconductor wafers 10 cooperate with each other to implement the function of the first packaged power semiconductor device 202.

The heat sink 40 is configured to implement heat dissipation of the power semiconductor wafer 10. The first outer surface 41 of the heat sink 40 is bonded to the second face 22 of the heat conduction layer 20, to implement effective heat transmission. On the heat sink 40, a plurality of heat sink fins 42 may be further disposed at a location facing away from the first outer surface 41, to increase a heat dissipation area. The heat sink 40 may be made of a metallic material, to achieve a better heat dissipation effect by using a feature of a comparatively high thermal conductivity coefficient of the metallic material.

The heat conduction layer 20 is configured to implement heat transfer of the power semiconductor wafer 10 and a function of electrical isolation between the power semiconductor wafer 10 and the heat sink 40. For details, refer to a schematic exploded view of the heat conduction layer 20 shown in FIG. 6. In an implementation, the heat conduction layer 20 may include an upper heat conduction layer 23, an insulation layer 24, and a lower heat conduction layer 25 that are stacked. The insulation layer 24 is located between the upper heat conduction layer 23 and the lower heat conduction layer 25. It may be understood that the first face 21 of the heat conduction layer 20 is located at the upper heat conduction layer 23, and the second face 22 is located at the lower heat conduction layer 25.

The upper heat conduction layer 23 and the lower heat conduction layer 25 are configured to implement a heat transfer function of the power semiconductor wafer 10, and a material of the upper and lower heat conduction layers may be aluminum, aluminum-containing alloy, copper, or copper-containing alloy. Heat generated when the power semiconductor wafer 10 works may be transferred to the heat sink 40 sequentially through the upper heat conduction layer 23, the insulation layer 24, and the lower heat conduction layer 25. The upper heat conduction layer 23 may be further capable of conducting electricity, to implement an electrical connection between the power semiconductor wafer 10 and the pin 50.

The insulation layer 24 is configured to implement electrical isolation between the power semiconductor wafer 10 and the heat sink 40. It may be understood that the heat sink 40 is electrically conductive when the heat sink 40 is made of a metallic material. Disposing the insulation layer 24 can prevent electrical conduction between the power semiconductor wafer 10 and the heat sink 40. A material of the insulation layer 24 may be ceramic.

The sealing part 30 wraps the outside of the power semiconductor wafer 10 and at least part of the heat conduction layer 20, to implement sealing and protection of the power semiconductor wafer 10 and at least part of the heat conduction layer 20, thereby reducing impact of mechanical stress, chemical contamination, or light source irradiation on the power semiconductor wafer 10, and ensuring implementation of the function of the first packaged power semiconductor device 202. A material of the sealing part 30 may be plastic, glass, or ceramic. The sealing part 30 also needs to be insulative. In some embodiments, the sealing part 30 wraps the lower heat conduction layer 25, with only the second face 22 exposed. In this case, the sealing part 30 is further in contact with the first outer surface 41 of the heat sink 40. In some other embodiments, the sealing part 30 may alternatively wrap only a part of the lower heat conduction layer 25, that is, the sealing part 30 and the first outer surface 41 are disposed at an interval. In addition, in these embodiments, the sealing part 30 completely wraps the power semiconductor wafer 10, the upper heat conduction layer 23, and the insulation layer 24, so that a reliable sealing and protection effect can be achieved for the power semiconductor wafer 10.

The pin 50 is configured to implement transmission of a current or a signal between the power semiconductor wafer 10 and an external circuit. The current may be a power supply current, and the signal may be a power supply signal. Therefore, the pin 50 needs to be electrically connected to the power semiconductor wafer 10. It can be seen from FIG. 5 that the pin 50 includes a connection segment 51 and an extension segment 52 along a length direction of the pin 50. The connection segment 51 is also wrapped in the sealing part 30, and the connection segment 51 is configured to electrically connect to the power semiconductor wafer 10. The extension segment 52 is located in an extension direction of the connection segment 51 facing away from the power semiconductor wafer 10 and is exposed outside the sealing part 30.

In the first packaged power semiconductor device 202, to achieve a better heat dissipation effect for the power semiconductor wafer 10, an area and a volume of the heat sink 40 are greater than those of the power semiconductor wafer 10 and are also greater than those of the sealing part 30. Therefore, at least part of a projection, of the extension segment 52 exposed outside the sealing part 30, on the heat sink 40 in the first direction 001 is located within the first outer surface 41. In other words, there is an interval distance D1 between at least part of the extension segment 52 and the first outer surface 41. A shortest distance between the extension segment 52 and the first outer surface 41, that is, a minimum value of the interval distance D1, needs to be greater than a creepage distance corresponding to a highest working voltage V1 of the power semiconductor wafer 10, to avoid a creepage phenomenon between the pin 50 and the first outer surface 41.

In a working process of the first packaged power semiconductor device 202, the power semiconductor wafer 10 has the highest working voltage V1. The highest working voltage V1 is input from the external circuit or output to the external circuit through the pin 50. Therefore, when the pin 50 is subject to the highest working voltage V1, if a distance between the extension segment 52 exposed outside the sealing part 30 and the first outer surface 41 is excessively small, a creepage phenomenon occurs between the extension segment 52 and the first outer surface 41 through a surface of the sealing part 30 or a surface of a component of another external circuit connected to the first packaged power semiconductor device 202, and consequently, normal working of the power semiconductor wafer 10 is affected.

In the first packaged power semiconductor device 202, the power semiconductor wafer 10 and the heat conduction layer 20 are both accommodated in the sealing part 30, thereby implementing integration and miniaturization of the power semiconductor wafer 10, the heat conduction layer 20, and the sealing part 30. In an assembling process, the second face 22 of the heat conduction layer 20 only needs to cover the first outer surface 41 of the heat sink 40 in a bonded manner. This is comparatively convenient. In an embodiment, the first packaged power semiconductor device 202 may be packaged according to the TO-247 standard. In some other embodiments, the first packaged power semiconductor device 202 may be alternatively packaged according to the TO-220 standard.

Thicknesses of the heat conduction layer 20 and the power semiconductor wafer 10 that are miniaturized may be comparatively small. In this case, because the sealing part 30 forms protection by wrapping the connection segment 51, it is not easy to break down an electrical connection between the connection segment 51 of the pin 50 and the power semiconductor wafer 10. However, the extension segment 52 is exposed outside the sealing part 30. For the first packaged power semiconductor device 202, a matched height of the shortest distance D1 between the extension segment 52 and the first outer surface 41 is set based on the highest working voltage V1 of the power semiconductor wafer 10, to avoid a creepage phenomenon that may occur between the extension segment 52 and the heat sink 40 through a surface of the sealing part 30 or a surface of a component of another external circuit connected to the first packaged power semiconductor device 202, when the power semiconductor wafer 10 works under the condition of the highest working voltage V1. This improves safety and reliability of the first packaged power semiconductor device 202 and ensures normal working of the power converter.

Figure 5:
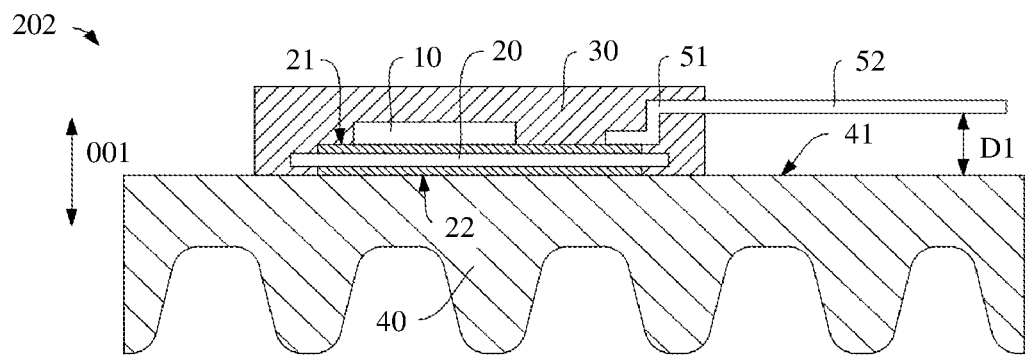
FIG. 5 is a cross-sectional schematic view of a packaged power semiconductor device.
Figure 6:
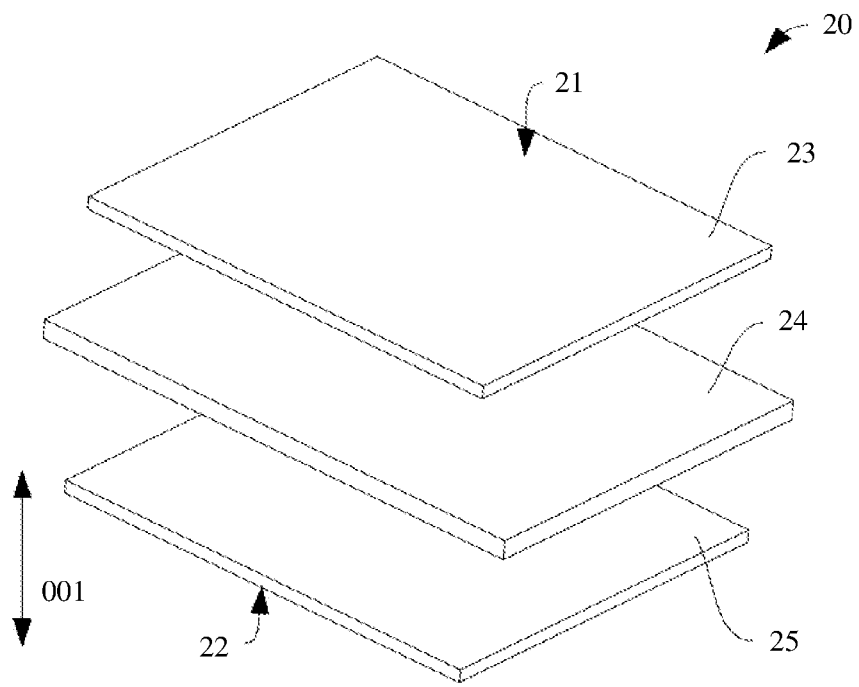
FIG. 6 is a schematic exploded view of a structure of a heat conduction layer in a packaged power semiconductor device.

It should be noted that the first packaged power semiconductor device 202 does not limit an extension path of the extension segment 52. The extension segment 52 may extend along a direction parallel to the first outer surface 41, as shown in FIG. 5. In this case, it is only necessary to ensure that the interval distance D1 between the extension segment 52 and the first outer surface 41 is greater than the creepage distance corresponding to the highest working voltage V1 of the power semiconductor wafer 10. In some other embodiments, the extension segment 52 may alternatively extend along a direction such as an oblique line or a curve (for example, a wavy line). In this case, it is necessary to ensure that the shortest distance D1 between the extension segment 52 and the first outer surface 41 is greater than the creepage distance corresponding to the highest working voltage V1 of the power semiconductor wafer 10.

In different use scenarios, the power semiconductor wafer 10 has different highest working voltages V1. Therefore, the shortest distance D1 between the extension segment 52 and the first outer surface 41 is also set differently. In some embodiments, when the highest working voltage of the power semiconductor wafer 10 is 400 V, the shortest distance D1 between the extension segment 52 and the first outer surface 41 may be set to be greater than or equal to 4 mm; when the highest working voltage of the power semiconductor wafer 10 is 1000 V, the shortest distance D1 between the extension segment 52 and the first outer surface 41 may be set to be greater than or equal to 7 mm.

In an implementation, the shortest distance D1 between the extension segment 52 and the first outer surface 41 may be alternatively set by using the following formula:

$$D1 \geq V1/200 + 2 \text{ (mm)} \qquad \text{formula (1)}$$

It should be noted that occurrence of the creepage phenomenon is also related to a contamination extent and humidity of the surface of the sealing part 30 and the surface of the component of the another external circuit connected to the first packaged power semiconductor device 202. When there is a comparatively large amount of contaminants or dust on the surface of the sealing part 30 or the surface of the component of the another external circuit, or the surface has comparatively high humidity, the creepage distance decreases, and a probability of occurrence of the creepage phenomenon correspondingly increases. During calculation of the creepage distance corresponding to the highest working voltage V1 of the power semiconductor wafer 10, proper adjustment may also be made with reference to a working scenario of the first packaged power semiconductor device 202.

Figure 7:
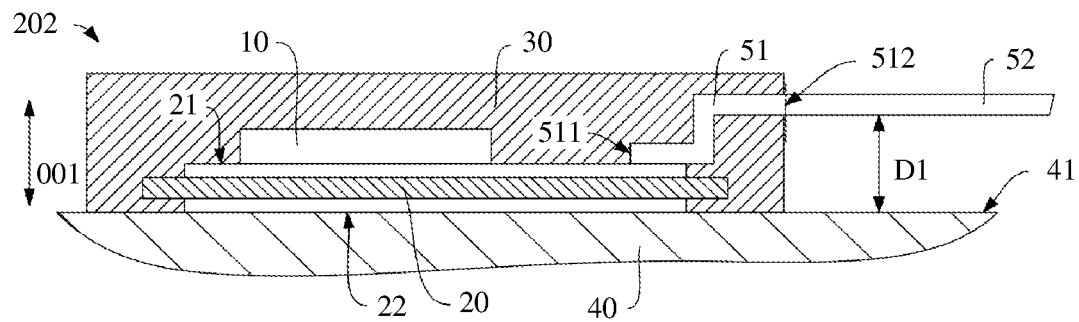
FIG. 7 is a partial cross-sectional schematic view of a packaged power semiconductor device.

Refer to a partial cross-sectional schematic view of the first packaged power semiconductor device 202, illustrated in FIG. 7. The connection segment 51 of the pin 50 has a first end 511 and a second end 512 that are opposite in the length direction of the pin 50. The first end 511 is configured to electrically connect to the power semiconductor wafer 10, and the second end 512 is connected to the extension segment 52. Along the first direction 001, a distance between the first end 511 and the first outer surface 41 is less than a distance between the second end 512 and the first outer surface 41. In other words, a height difference is formed between the first end 511 and the second end 512 in relation to the first outer surface 41.

As mentioned above, in the miniaturized first packaged power semiconductor device 202, the thicknesses of the power semiconductor wafer 10 and the heat conduction layer 20 are comparatively small. To ensure a distance between the extension segment 52 and the first outer surface

41, the connection segment 51 needs to be provided in a bent or inclined shape, so that the second end 512 of the connection segment 51 is higher than the first end 511. Therefore, after the extension segment 52 is connected to the second end 512 that is higher from the first outer surface 41, it can be ensured that the shortest distance D1 between the extension segment 52 and the first outer surface 41 is greater than the creepage distance corresponding to the preset highest working voltage V1 of the power semiconductor wafer 10.

Figure 8:
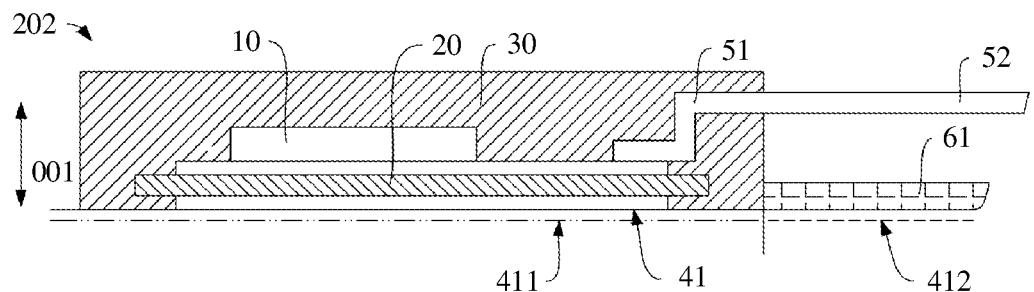
FIG. 8 is a partial cross-sectional schematic view of another packaged power semiconductor device.

As shown in FIG. 8, in this embodiment, the first outer surface 41 further includes a first region 411 and a second region 412 along the extension direction of the pin 50. The first region 411 is configured to be bonded to the second face 22 of the heat conduction layer 20 and may be further configured to be bonded to at least part of the sealing packaging part 30. The second region 412 is located on one side of the sealing part 30, and the extension segment 52 is also located on the same side as the second region 412 in relation to the sealing part 30. In other words, a projection of the extension segment 52 on the first outer surface 41 is located in the second region 412. A distance between the extension segment 52 and the second region 412 is the distance between the extension segment 52 and the first outer surface 41.

In the embodiment in FIG. 8, the second region 412 is further covered with an insulation film 61 in a bonded manner. It may be understood that the insulation film 61 is located between the extension segment 52 and the first outer surface 41. The insulation film 61 has an insulation function. When the insulation film 61 is disposed between the extension segment 52 and the first outer surface 41, a distance between the extension segment 52 and the heat sink 40 through a surface of a component increases from a distance through the surface of the sealing part 30 to a distance through the surface of the sealing part 30 and a surface of the insulation film 61. This prevents the creepage phenomenon between the extension segment 52 and the heat sink 40.

Figure 9:
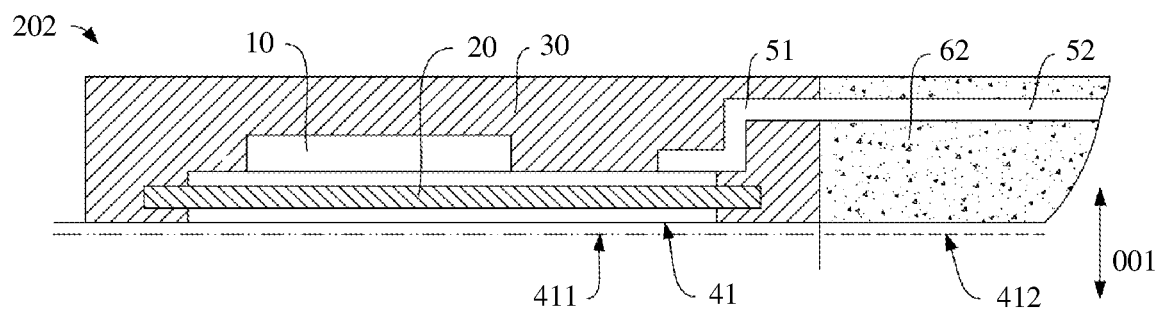
FIG. 9 is a partial cross-sectional schematic view of another packaged power semiconductor device.

In an embodiment in FIG. 9, sealant pouring processing is further performed on the extension segment 52, to form a sealant pouring structure 62 at least between the extension segment 52 and the second region 412. It may be understood that the sealant pouring structure 62 also has an insulation function. When the sealant pouring structure 62 is disposed between the extension segment 52 and the second region 412, impact of contamination, dust, moisture, and the like on the surface of the sealing part 30 and the surface of the component of the another external circuit connected to the first packaged power semiconductor device 202 can be effectively reduced, and an effect of preventing the creepage phenomenon similarly to the insulation film 61 can also be achieved. As illustrated in FIG. 9, the sealant pouring structure 62 further wraps the entire extension segment 52. A side of the extension segment 52 facing away from the first outer surface 41 may be wrapped by the sealant pouring structure 62. The sealant pouring structure 62 can form protection for the extension segment 52.

Figure 10:
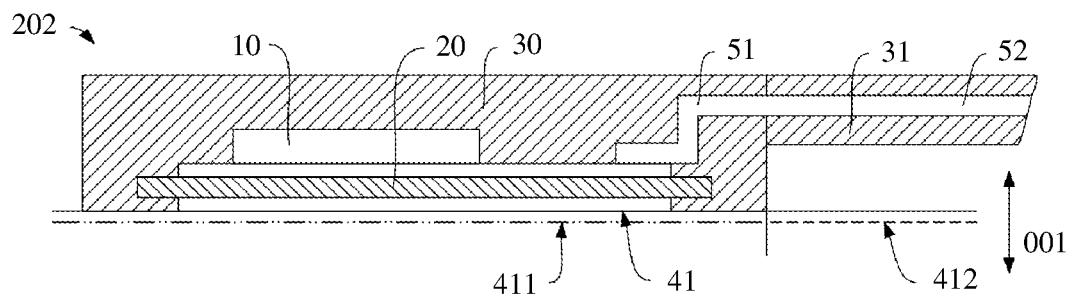
FIG. 10 is a partial cross-sectional schematic view of another packaged power semiconductor device.

In an embodiment in FIG. 10, the sealing part 30 is further provided with an extension section 31. The extension section 31 extends along a path of the extension segment 52, thereby wrapping and protecting the extension segment 52. The sealing part 30 has an insulation function, and therefore, the extension section 31 also provides a better insulation effect between the extension segment 52 and the first outer surface 41. Similar to functions of the insulation film 61 and the sealant pouring structure 62, the extension section 31 can also achieve an effect of further preventing the creepage phenomenon. It may be understood that a material of the extension section 31 is the same as the material of the sealing part 30, and the extension section 31 and the sealing part 30 may be fabricated separately and then assembled or may be fabricated through integrated forming.

Figure 11:
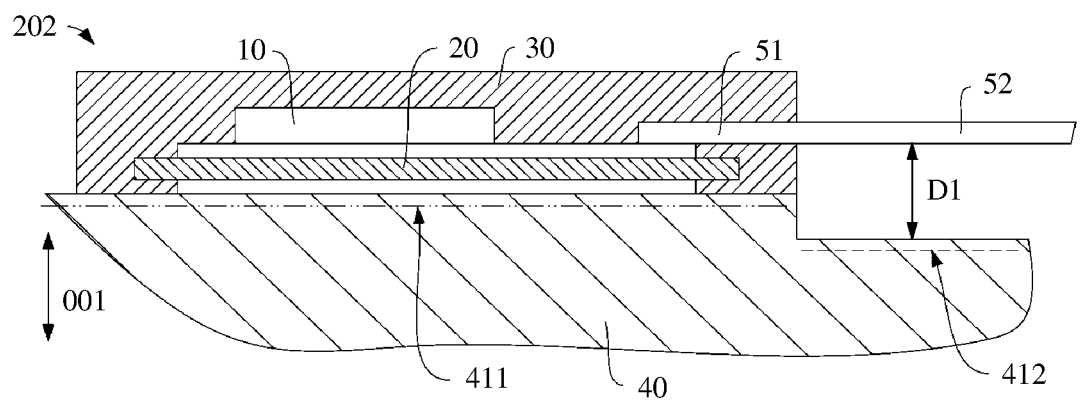
FIG. 11 is a partial cross-sectional schematic view of another packaged power semiconductor device.

In some other embodiments, the first outer surface 41 may be further provided as a skew structure, such as a stepped structure (as shown in FIG. 11) or a bevel structure, so that a height difference is also formed between the second region 412 and the first region 411 in the first direction 001, and the first region 411 is higher, that is, the first region 411 is closer to the extension segment 52 than the second region 412. As mentioned above, the distance between the extension segment 52 and the second region 412 is the shortest distance between the extension segment 52 and the first outer surface 41. Therefore, setting the height difference between the first region 411 and the second region 412 is more conducive to controlling the distance D1 between the extension segment 52 and the first outer surface 41. In this way, the interval distance between the extension segment 52 and the first outer surface 41 can be increased, thereby improving reliability of the first packaged power semiconductor device 202; or a thickness of the sealing part 30 is reduced on the premise that the safe interval distance is maintained, thereby further implementing miniaturization of the first packaged power semiconductor device 202. As illustrated in FIG. 11, the connection segment 51 extends along a direction parallel to the first region 411, and the extension segment 52 extends along a direction parallel to the second region 412, so that a height of the sealing part 30 is correspondingly reduced, and an overall thickness of the first packaged power semiconductor device 202 is also reduced.

Figure 12:
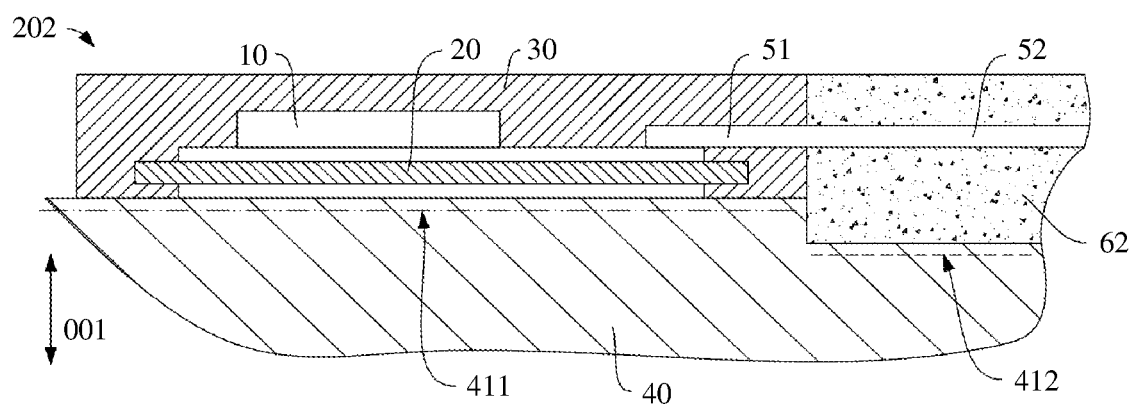
FIG. 12 is a partial cross-sectional schematic view of another packaged power semiconductor device.

It may be understood that structures such as the insulation film 61, the sealant pouring structure 62, and the extension section 32 in FIG. 8 to FIG. 10 all form insulation-part structures between the extension segment 52 and the first outer surface 41, and therefore, effects achieved by the structures are also similar. In the structure in FIG. 11, the height difference between the first region 411 and the second region 412 is set, so that the safe distance between the extension segment 52 and the first outer surface 41 is also ensured. In some embodiments, alternatively, an insulation-part structure and a height difference between the first region 411 and the second region 412 may be implemented in combination. For example, as illustrated in FIG. 12, on a basis that a height difference is set between the first region 411 and the second region 412, sealant pouring is further performed on the extension segment 52, so that the height difference can be combined with the sealant pouring structure 62 to jointly form protection for the extension segment 52, thereby avoiding the creepage phenomenon between the extension segment 52 and the second region 412.

In an implementation in FIG. 7, the pin 50 is further fixedly connected to the heat conduction layer 20, to implement the electrical connection between the pin 50 and the power semiconductor wafer 10. The first end 511 of the connection segment 51 of the pin 50 may be fixedly connected to the upper heat conduction layer 23, to implement a fixed connection between the pin 50 and the heat conduction layer 20. In addition, the power semiconductor wafer 10 is also bonded to the upper heat conduction layer 23. The upper heat conduction layer 23 is capable of conducting electricity, to implement reliable conduction between the connection segment 51 and the power semiconductor wafer 10.

It can be seen from the illustrations in FIG. 1 and FIG. 2 that, when connected to an external circuit, the first packaged power semiconductor device 202 has at least two ports, so that a current can enter the first packaged power semiconductor device 202 from one port, pass through the power semiconductor wafer 10, and then exit from the other port. Therefore, a quantity of pins 50 in the first packaged power semiconductor device 202 needs to be set to 2 or more, and the pins 50 need to be isolated from each other. To implement electrical connections between different pins 50 and the power semiconductor wafer 10, the upper heat conduction layer 23 connected between the pins 50 and the power semiconductor wafer 10 also needs to be divided into two or more heat conduction regions 231 that are isolated from each other. Each heat conduction region 231 correspondingly connects one pin 50, to implement an electrical connection and a current transmission or signal transmission function between each pin 50 and the power semiconductor wafer 10.

Figure 13:
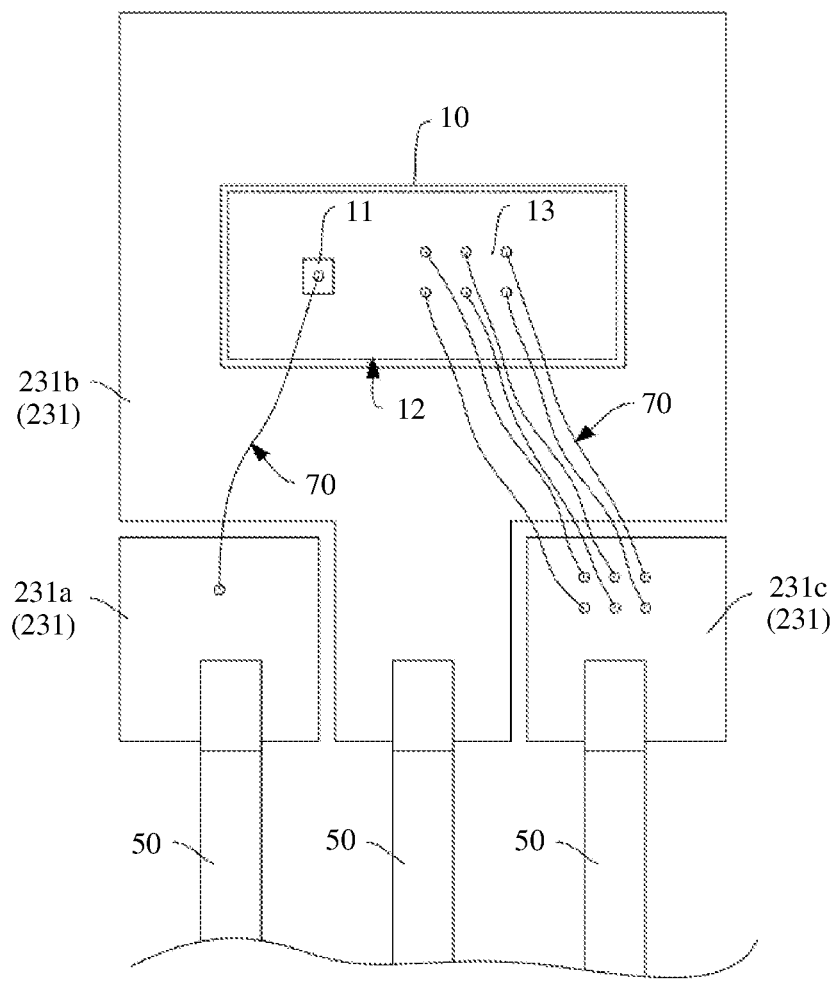
FIG. 13 is a schematic plan view of an internal structure of a packaged power semiconductor device.

An internal planar structure of the first packaged power semiconductor device 202 is illustrated in FIG. 13. In this embodiment, the power semiconductor wafer 10 is implemented by using an insulated gate bipolar transistor. The insulated gate bipolar transistor has a total of three functional ports: a gate electrode 11, a collector 12, and an emitter 13. The gate electrode 11 and the emitter 13 are both located on a surface of a side of the power semiconductor wafer 10 facing away from the upper heat conduction layer 23. The collector 12 is located on a surface of a side of the power semiconductor wafer 10 bonded to the upper heat conduction layer 23. In the embodiment shown in the figure, an entire surface on which the power semiconductor wafer 10 is bonded and electrically connected to the upper heat conduction layer 23 is used as the collector 12.

Correspondingly, a quantity of pins 50 is also set to 3. In addition, the upper heat conduction layer 23 is divided into a first heat conduction region 231a, a second heat conduction region 231b, and a third heat conduction region 231c. Each two of the three heat conduction regions 231 are isolated from each other, so that the three heat conduction regions 231 are insulated from each other. The power semiconductor wafer 10 is bonded to the second heat conduction region 231b and makes the collector 12 be connected to the second heat conduction region 231b. The first heat conduction region 231a and the third heat conduction region 231c are disposed on two opposite sides of the second heat conduction region 231b. It may be understood that, in other embodiments, the power semiconductor wafer 10 may be alternatively bonded to the first heat conduction region 231a or the third heat conduction region 231c. Alternatively, in some other embodiments, the first heat conduction region 231a and the third heat conduction region 231c may be located on a same side of the second heat conduction region 231b. A location of the power semiconductor wafer 10 and relative locations of the heat conduction regions 231 may be randomly arranged based on an actual scenario or a function requirement.

In this embodiment, the first packaged power semiconductor device 202 further includes a connection wire 70. There are also two or more connection wires 70 (There are seven connection wires 70 illustrated in FIG. 13). The connection wire 70 is configured to implement an electrical connection between the power semiconductor wafer 10 and each of the first heat conduction region 231a and the third heat conduction region 231c. The connection wire 70 is separately fixedly connected to the gate electrode 11 and the emitter 13 that are on the surface of the power semiconductor wafer 10 facing away from the upper heat conduction layer 23. Then, the connection wire 70 separately extends toward and is fixedly connected to the first heat conduction region 231a and the third heat conduction region 231c, so that the first heat conduction region 231a is connected to the gate electrode 11, and the third heat conduction region 231c is connected to the emitter 13.

Figure 14:
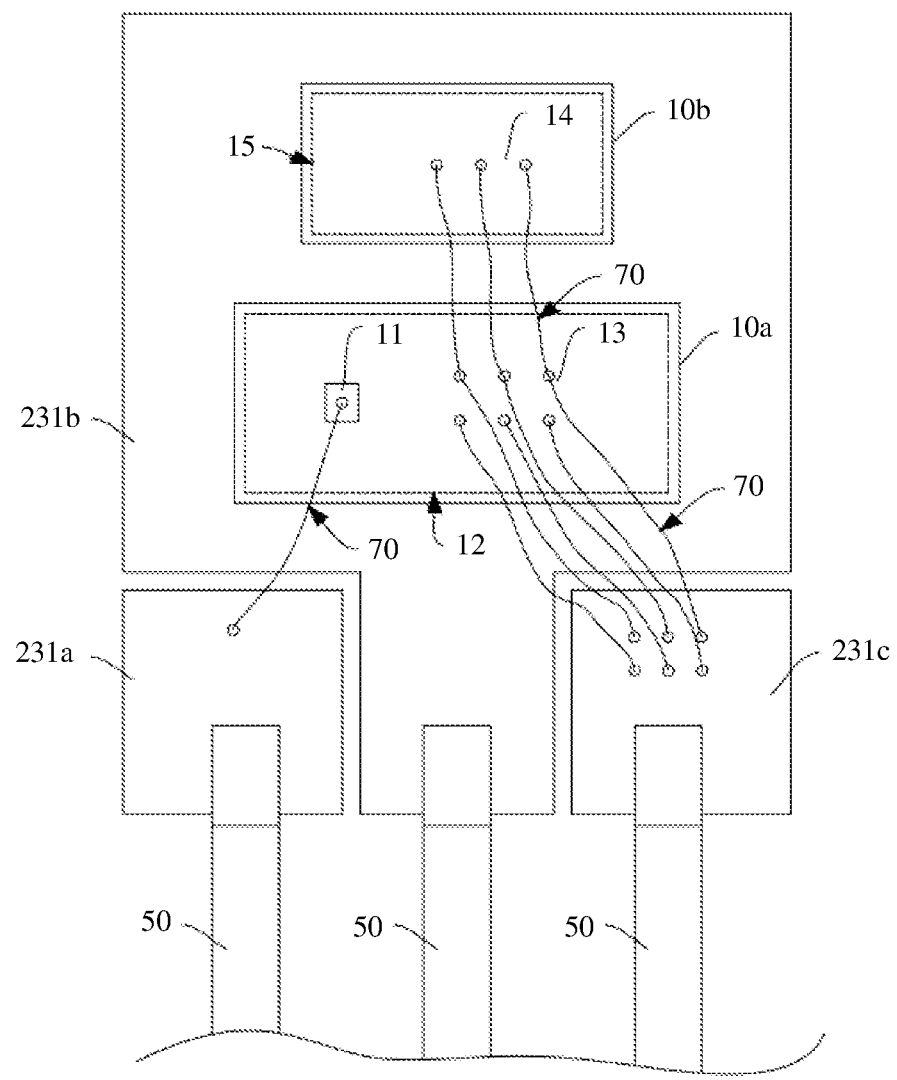
FIG. 14 is a schematic plan view of an internal structure of another packaged power semiconductor device.

However, two power semiconductor wafers 10: a first power semiconductor wafer 10a and a second power semiconductor wafer 10b, are disposed in an internal planar structure of the first packaged power semiconductor device 202 shown in FIG. 14. The first power semiconductor wafer 10a may also be an insulated gate bipolar transistor, which also has a total of three function ports: the gate electrode 11, the collector 12, and the emitter 13. Correspondingly, a quantity of pins 50 is also set to 3, and the upper heat conduction layer 23 is also divided into the first heat conduction region 231a, the second heat conduction region 231b, and the third heat conduction region 231c. The power semiconductor wafer 10 is also bonded to the second heat conduction region 231b, and the connection wire 70 is also separately connected between the gate electrode 11 and the first heat conduction region 231a, and between the emitter 13 and the third heat conduction region 231c. The three pins 50 are fixedly connected to the first heat conduction region 231a, the second heat conduction region 231b, and the third heat conduction region 231c respectively, to separately implement a current transmission or signal transmission function between an external circuit and the gate electrode 11, the collector 12, and the emitter 13 that are of the insulated gate bipolar transistor.

The second power semiconductor wafer 10b may be a diode. The second power semiconductor wafer 10b is also bonded to the second heat conduction region 231b, and the diode may include an anode 14 and a cathode 15. The cathode 15 is located on a side on which the second power semiconductor wafer 10b is bonded to the upper heat conduction layer 23 and is connected to the second heat conduction layer 231b. As illustrated in the figure, an entire surface, of the second power semiconductor wafer 10b, electrically connected to the upper heat conduction layer 23, is used as the cathode 15. The anode 14 is located on a side of the second power semiconductor wafer 10b facing away from the upper heat conduction layer 23. The connection wire 70 is fixedly connected between the second power semiconductor wafer 10b and the first power semiconductor wafer 10a, so that the first power semiconductor wafer 10a and the second power semiconductor wafer 10b are connected. The diode may have a unidirectional connection function. The connection wire 70 is connected between the anode 14 and the emitter 13, to be forward connected to the second power semiconductor wafer 10b, namely, the diode, when a voltage in the first power semiconductor wafer 10a is reverse, thereby avoiding a phenomenon that the first power semiconductor wafer 10a may be damaged due to an excessively high reverse voltage.

Figure 15:
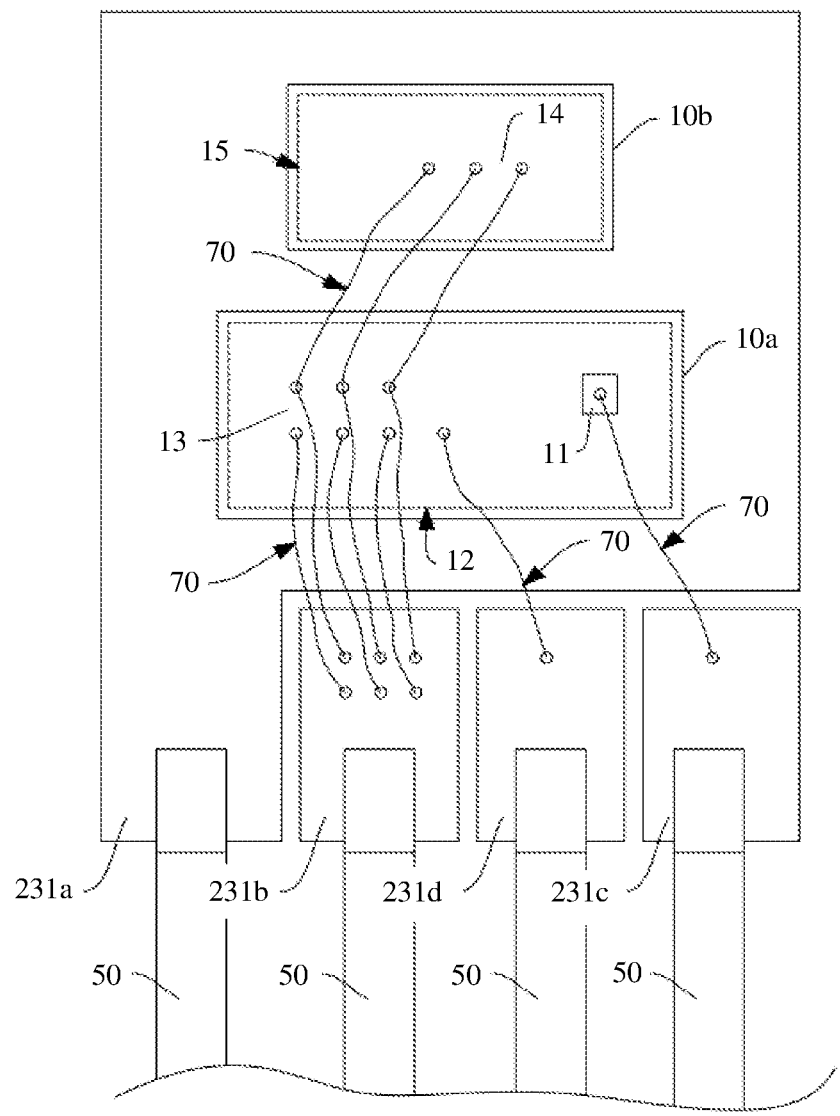
FIG. 15 is a schematic plan view of an internal structure of another packaged power semiconductor device.

FIG. 15 illustrates an internal planar structure of another first packaged power semiconductor device 202. As illustrated in FIG. 15, the first power semiconductor wafer 10a and the second power semiconductor wafer 10b are also disposed. The first power semiconductor wafer 10a may also be an insulated gate bipolar transistor, and the second power semiconductor wafer 10b may also be a diode. In addition, as illustrated in FIG. 15, the first power semiconductor wafer 10a and the second power semiconductor wafer 10b are located on the first heat conduction region 231a. The connection wire 70 is separately connected between the first power semiconductor wafer 10a and the second heat conduction region 231b, between the first power semiconductor wafer 10a and the third heat conduction region 231c, and between the second power semiconductor wafer 10b and the second heat conduction region 231b. Further, as illustrated in FIG. 15, a fourth heat conduction region 231d is further disposed in an isolated manner between the third heat conduction region 231c and the second heat conduction region 231b. The emitter 13 on the first power semiconductor wafer 10a is connected to the fourth heat conduction region 231d through one or more separate connection wires 70 and is connected to an external circuit through the pin 50 fixed to the fourth heat conduction region 231d. In this embodiment, the power semiconductor wafer 10a uses a Kelvin connection method, and no power current passes through a transmission path of the fourth heat conduction region 231d, to eliminate impact of the power current on driving of the power semiconductor wafer in the semiconductor circuit 200.

Figure 16:
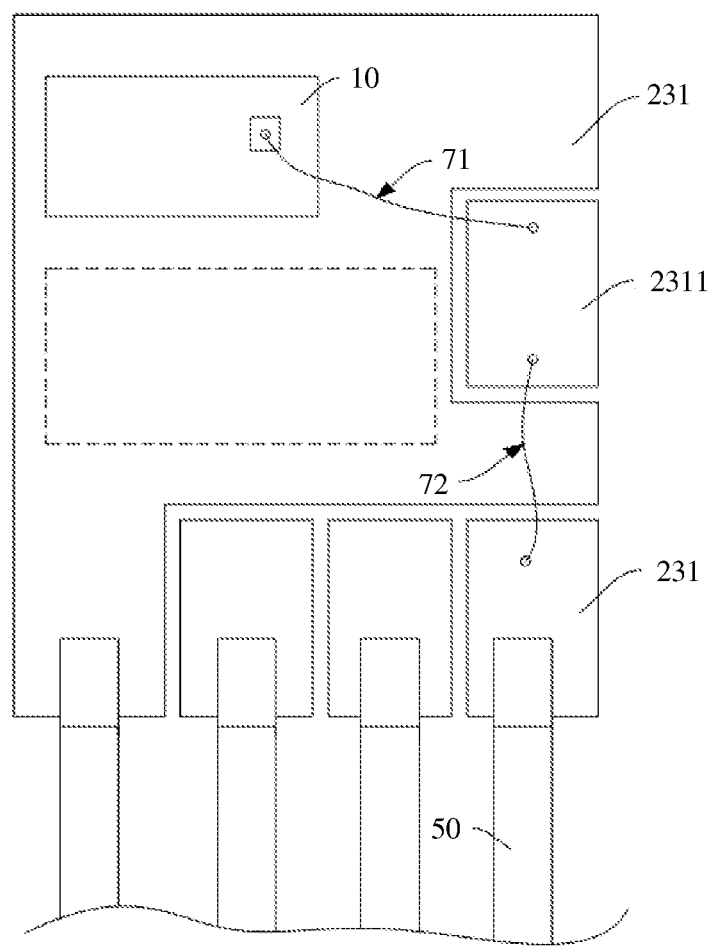
FIG. 16 is a schematic plan view of an internal structure of another packaged power semiconductor device.

As shown in FIG. 16, in the first packaged power semiconductor device 202, the connection wire 70 may be further divided into a first segment 71 and a second segment 72, and an intermediate heat conduction region 2311 may be further disposed at the upper heat conduction layer 23. The first segment 71 and the second segment 72 are bridged through the intermediate heat conduction region 2311, to implement a current transmission or signal transmission function of the connection wire 70. In other words, in the first packaged power semiconductor device 202, a quantity of heat conduction regions 231 may further be greater than a quantity of pins 50. As shown in FIG. 16, because a distance between the power semiconductor wafer 10 and the pin 50 is long, if an electrical connection function between the power semiconductor wafer 10 and the pin 50 is completely implemented by using the connection wire 70, a transmission path of the connection wire 70 is long and is prone to interference. Alternatively, in some packaged devices with a large quantity of power semiconductor wafers 10, the quantity of connection wires 70 also increases correspondingly, which is not conducive to arrangement and layout of the connection wires 70.

The intermediate heat conduction region 2311 is disposed between the power semiconductor wafer 10 and the pin 50 and is bridged between the first segment 71 and the second segment 72, thereby shortening an overall length of the connection wire 70, ensuring quality of a transmitted current and signal, facilitating orderly arrangement of the connection wires 70, and avoiding an assembly error of the connection wire 70.

The foregoing description is merely an embodiment but is not intended as limiting. Any variation or replacement readily figured out by a person skilled in the art, for example, removing or adding a mechanical part, or changing a shape of a mechanical part, shall fall within the scope of the embodiments. Embodiments and features in embodiments may be combined with each other provided that no conflict occurs.

What is claimed is:

1. A packaged power semiconductor device, comprising:
a power semiconductor wafer;
a heat conduction layer comprising an upper heat conduction layer, an insulation layer, and a lower heat conduction layer that are stacked, wherein the insulation layer is located between the upper heat conduction layer and the lower heat conduction layer, and the upper heat conduction layer is bonded to the power semiconductor wafer;
a heat sink comprising a first outer surface, wherein the first outer surface is bonded to the lower heat conduction layer;
a sealing part configured to wrap and seal the power semiconductor wafer and at least part of the heat conduction layer; and
a pin comprising a connection segment and an extension segment, wherein the connection segment is electrically connected to the power semiconductor wafer and is also wrapped in the sealing part, the extension segment is located outside the sealing part;
wherein the first outer surface comprises a first region and a second region, the lower heat conduction layer is bonded to the first outer surface in the first region, a projection of the extension segment on the first outer surface is located in the second region, and the first outer surface is a stepped structure, and a height difference is formed between the second region and the first region in a first direction so as to make the shortest distance between the extension segment and the first outer surface is greater than a creepage distance corresponding to a highest working voltage of the power semiconductor wafer;
the pin is fixedly connected to the upper heat conduction layer to implement an electrical connection between the pin and the power semiconductor wafer;
the power semiconductor wafer comprises a first functional port located on a side of the power semiconductor wafer closer to the upper heat conduction layer, and the first functional port is electrically connected to the pin through the upper heat conduction layer;
the power semiconductor wafer further comprises a second functional port, the upper heat conduction layer comprises a first heat conduction region and a second heat conduction region that are isolated from each other, there are two pins, the first functional port is connected to one pin through the first heat conduction region, and the second functional port is connected to the other pin through the second heat conduction region;
the packaged power semiconductor device comprises a connection wire connected between the second functional port of the power semiconductor wafer and the second heat conduction region, to implement an electrical connection between the second functional port and the pin fastened on the second heat conduction region; and
the connection wire comprises a first segment and a second segment, the upper heat conduction layer further comprises an intermediate heat conduction region, the first segment is connected between the second functional port and the intermediate heat conduction region, and the second segment is connected between the intermediate heat conduction region and the second heat conduction region.

2. The packaged power semiconductor device according to claim 1, wherein along a length direction of the connection segment, the connection segment has a first end and a second end that are opposite, the first end is electrically connected to the power semiconductor wafer, the second end is connected to the extension segment, and a distance between the first end and the first outer surface is less than a distance between the second end and the first outer surface.

3. The packaged power semiconductor device according to claim 1, wherein the packaged power semiconductor device further comprises an insulation part located between the first outer surface and the extension segment.

4. The packaged power semiconductor device according to claim 1, wherein in a direction of stacking the power semiconductor wafer and the heat conduction layer, a distance between the extension segment and the first region is less than a distance between the extension segment and the second region.

5. A power converter, comprising at least one packaged power semiconductor device and a controller, wherein the controller is configured to control turn-on and turn-off of a packaged power semiconductor device to perform power conversion, and the packaged power semiconductor device, comprises:

a power semiconductor wafer;

a heat conduction layer, comprising an upper heat conduction layer, an insulation layer, and a lower heat conduction layer that are stacked, wherein the insulation layer is located between the upper heat conduction layer and the lower heat conduction layer, and the upper heat conduction layer is bonded to the power semiconductor wafer;

a heat sink, comprising a first outer surface, wherein the first outer surface is bonded to the lower heat conduction layer;

a sealing part, configured to wrap and seal the power semiconductor wafer and at least part of the heat conduction layer; and a pin, comprising a connection segment and an extension segment, wherein the connection segment is electrically connected to the power semiconductor wafer and is also wrapped in the sealing part, the extension segment is located outside the sealing part;

wherein the first outer surface comprises a first region and a second region, the lower heat conduction layer is bonded to the first outer surface in the first region, a projection of the extension segment on the first outer surface is located in the second region, and the first outer surface is a stepped structure, and a height difference is formed between the second region and the first region in a first direction so as to make the shortest distance between the extension segment and the first outer surface is greater than a creepage distance corresponding to a highest working voltage of the power semiconductor wafer;

the pin is fixedly connected to the upper heat conduction layer to implement an electrical connection between the pin and the power semiconductor wafer;

the power semiconductor wafer comprises a first functional port located on a side of the power semiconductor wafer closer to the upper heat conduction layer, and the first functional port is electrically connected to the pin through the upper heat conduction layer;

the power semiconductor wafer further comprises a second functional port, the upper heat conduction layer comprises a first heat conduction region and a second heat conduction region that are isolated from each other, there are two pins, the first functional port is connected to one pin through the first heat conduction region, and the second functional port is connected to the other pin through the second heat conduction region;

the packaged power semiconductor device comprises a connection wire connected between the second functional port of the power semiconductor wafer and the second heat conduction region, to implement an electrical connection between the second functional port and the pin fastened on the second heat conduction region; and the connection wire comprises a first segment and a second segment, the upper heat conduction layer further comprises an intermediate heat conduction region, the first segment is connected between the second functional port and the intermediate heat conduction region, and the second segment is connected between the intermediate heat conduction region and the second heat conduction region.

6. The power converter according to claim 5, wherein along a length direction of the connection segment, the connection segment has a first end and a second end that are opposite, the first end is electrically connected to the power semiconductor wafer, the second end is connected to the extension segment, and a distance between the first end and the first outer surface is less than a distance between the second end and the first outer surface.

7. The power converter according to claim 6, wherein the packaged power semiconductor device further comprises an insulation part located between the first outer surface and the extension segment.

8. The power converter according to claim 6, wherein in a direction of stacking the power semiconductor wafer and the heat conduction layer, a distance between the extension segment and the first region is less than a distance between the extension segment and the second region.

* * * * *